United States Patent [19]

Inazumi et al.

[11] Patent Number: 5,109,360
[45] Date of Patent: Apr. 28, 1992

[54] ROW/COLUMN ADDRESS INTERCHANGE FOR A FAULT-TOLERANT MEMORY SYSTEM

[75] Inventors: Junichi Inazumi, Yokohama; Shigetaka Inazumi, Isehara; Jun Nakamoto, Machida, all of Japan

[73] Assignee: International Business Machines Corporation, Armonk, N.Y.

[21] Appl. No.: 530,704

[22] Filed: May 11, 1990

[30] Foreign Application Priority Data

May 12, 1989 [JP] Japan .................................. 1-117282

[51] Int. Cl.⁵ .............................................. G11C 29/00
[52] U.S. Cl. ...................................... 365/200; 365/201; 365/230.02; 365/230.03; 371/11.1
[58] Field of Search ........................... 371/11.1, 10.3; 365/200, 201, 230.02, 230.03

[56] References Cited

U.S. PATENT DOCUMENTS 4,768,193  8/1988  Takemae ........................ 371/10.3
5,042,007  8/1991  Diluna ......................... 365/330.02

FOREIGN PATENT DOCUMENTS 96782  12/1983  European Pat. Off. ......... 371/11.1

Primary Examiner—Joseph E. Clawson, Jr.
Attorney, Agent, or Firm—Mark F. Chadurjian

[57] ABSTRACT

A memory system in which access to faulty memory blocks is prevented. A test is carried out to see if there are enough functional memory blocks to store a given amount of information. If not, an address mode signal is generated that interchanges the row/column accesses for a given multi-bit address word, such that a line fault is isolated to only one memory block. This reconfigures the system to maximize available memory space without adding excessive access delays.

15 Claims, 5 Drawing Sheets

MULTIPLEXER

ADDRESS DECODER

ROW/COLUMN ADDRESS INTERCHANGE FOR A FAULT-TOLERANT MEMORY SYSTEM

BACKGROUND OF THE INVENTION

A. Field of the invention

This invention relates generally to a fault-tolerant memory system, and more particularly to an addressing system of the block management type which excludes faulty memory blocks from those to be addressed.

B. Background Art

As the storage capacity of semiconductor memories continues to increase as a function of lower chip manufacturing costs and higher integration densities, so does the percentage of chips having too many faulty storage cells to fix using conventional on-chip fault recovery techniques such as redundancy. Accordingly, in a memory system of the "block management" type (i.e. a memory chip wherein the array of memory cells are broken up into individual sub-arrays or "blocks"), or tests are conducted when the chip is first activated to exclude those blocks containing error locations from those to be accessed.

For example, according to the invention disclosed in Published Unexamined patent application (JPUPA) no. 51-25941, a check circuit having a self-diagnosing function is provided for each memory block, so as to successively shift the input addresses, excluding the blocks in which errors have been detected. In this method, if a stationary failure (i.e. a hardware fail, as opposed to a soft error due to radiation) occurs along an address line selected by a row address and a column address, errors will be promulgated in all blocks linked t that address line.

In JPUPA No. 57-109198, a word is accessed from a plurality of memory blocks by addressing these blocks with the same row and column addresses. Normally, if two errors occur in the same word, the word will not be correctable by double error detect, single error correct (DED/SEC) error correction code (ECC) techniques. Accordingly, in the JPUPA one of the blocks in which errors occur is addressed with the row and column addresses interchanged so that another location involving no error may be addressed, whereby a plurality of errors in the same word are converted into a single error that can be corrected using ECC. This method deals with soft errors by temporarily switching the row/column address for a given memory block containing an error; always dealing with stationary errors in this way, however, is not desirable because of the prolonged processing time associated with the address interchanges for respective blocks. Moreover, only one error block is corrected in this fashion; if there are multiple error blocks, most will not be corrected and will decrease the overall storage capacity of the memory.

Further, JPUPA 63-128, 820 discloses an interleave method wherein write operations into the memory are conducted in the row direction while read operations are conducted in the column direction. Again, because a given word is read from different rows, any "burst errors" (i.e. multi-bit errors) occurring during a write are converted into random errors in reading, thereby enabling correction by ECC. However, while this method is effective for continuous data reading, it is not suitable for error correction of data which are randomly read out.

As illustrated by the art discussed above, it is generally known to provide fault tolerance by simply by passing memory blocks containing faulty cell locations. However, such systems do not adequately address burst errors encompassing a plurality of blocks, such as an address line failure wherein the circuitry activating a given row/column of cells is faulty. Simply reducing the number of usable blocks is not satisfactory where the number of blocks excluded becomes so great that the remaining memory capacity is insufficient to store the requisite amount of information, e.g., for a program.

SUMMARY OF THE INVENTION

It is thus an object of the present invention to correct for block errors in a memory system.

It is another object of the invention to correct for block errors without denying access to all of the affected blocks.

It is yet another object of the invention to correct for block errors without adding a large amount of access delay in correcting stationary errors.

The present invention provides a means that generates an address switching signal only when the number of the memory blocks having no faulty cell locations provides insufficient storage capacity for a given amount of information to be stored. Should such a condition occur, the access means that generates the row and column address signals for the memory interchanges the row and column address signals for all of the blocks of the memory.

BRIEF DESCRIPTION OF THE DRAWING

The foregoing and other structures and teachings of the present invention will become more apparent upon review of the best mode for carrying out the invention as described below. In the description to follow, reference will be made to the accompanying Drawing, in which.

DESCRIPTION OF THE BEST MODE FOR CARRYING OUT THE INVENTION

Figure 1:
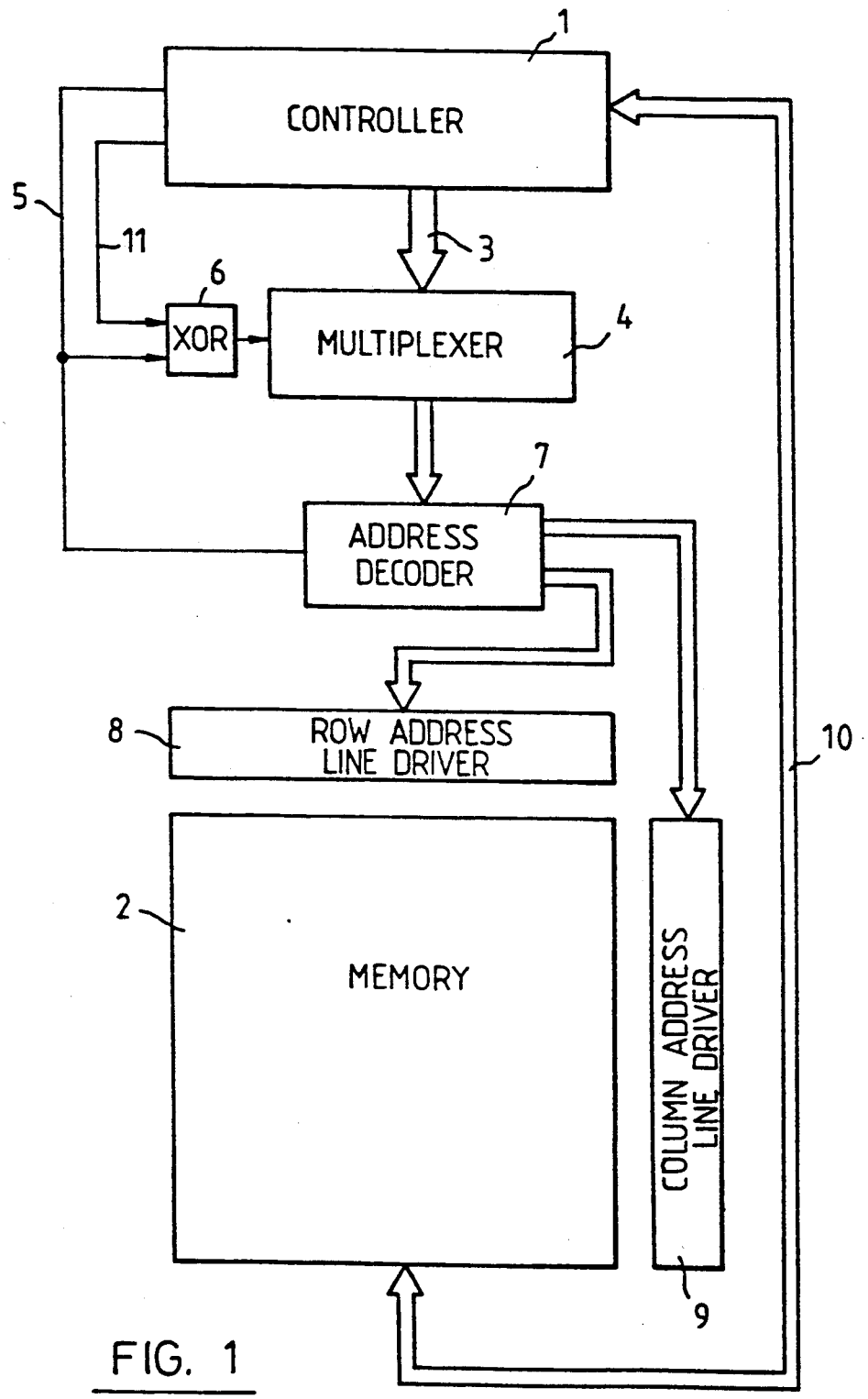
FIG. 1 is a block diagram of the memory system of the present invention.

FIG. 1 is a block diagram of a memory system in which the present invention is embodied. A controller 1 provides 20-bit address signals under program control to a multiplexer 4 through an address line 3 for addressing a one mega-byte memory 2. The multiplexer 4 provides a 10-bit address decoder 7 the upper ten bits and the lower ten bits of the 20-bit address signal in succession, in response to the selection signal from the controller 1 through a control line 5 and an XOR circuit 6. In turn, the address decoder 7 activates a row address line driver 8 as selected by the upper 10 bits of the address signal, and a column address line driver 9 as selected by the lower 10 bits of the address signal in succession. and further in response to the selection signal from the controller 1. Accordingly, as a function of the 20-bit address signals fed from the controller 1, the selected row address line driver 8 and column address line driver 9 address respective row/column locations within the memory array 2. Data to be written into the selected row/column locations are fed from the controller 1 through a data bus 10, while data read out from those locations are fed to the controller 1 through the data bus 10.

Figure 2:
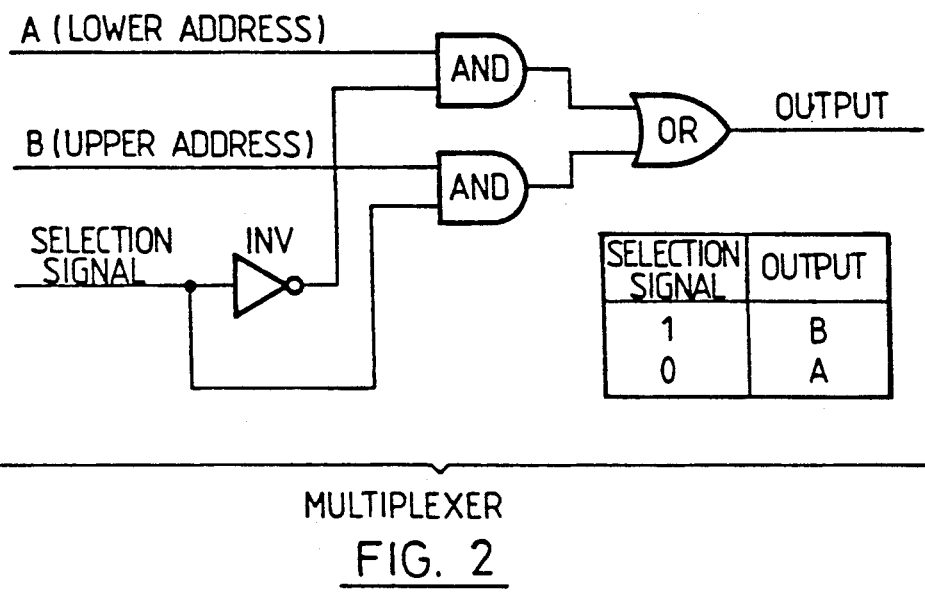
FIG. 2 is a block diagram of the multiplexer 4 of Fig. 1, with a truth table showing the inputs and resulting outputs therefor.
Figure 3:
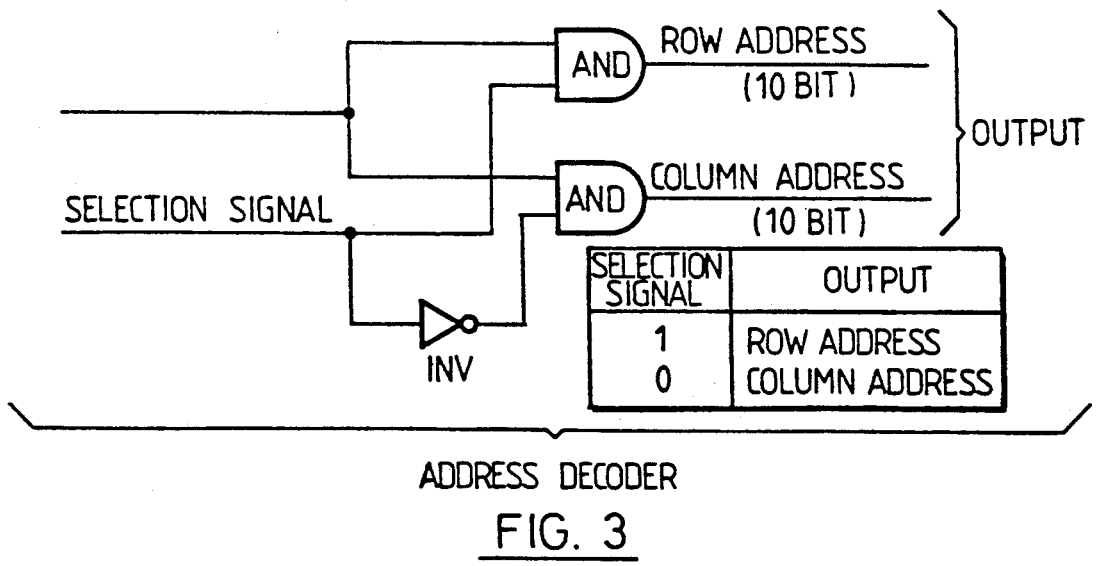
FIG. 3 is a block diagram of the address decoder 7 of FIG. 1 with a truth table showing the inputs and results outputs therefor.

FIG. 2 shows a logic circuit diagram of the multiplexer 4 in FIG. 1 and a truth table representing the relationship between the selection signal and the output signal, and FIG. 3 shows a logic circuit diagram of the address decoder 7 in FIG. 1 and a truth table representing the relationship between the selection signal and the output signal.

Figure 4:
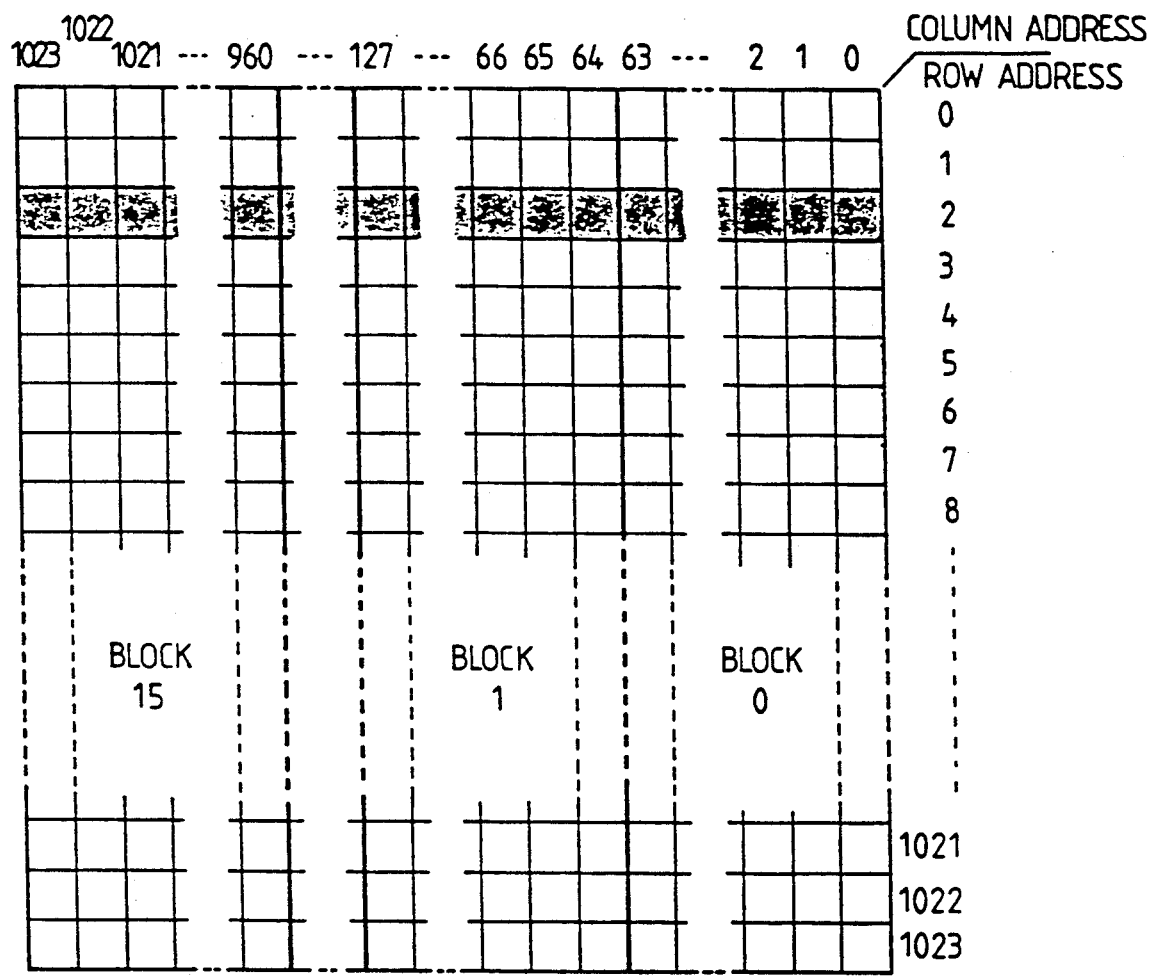
FIG. 4 is a normal logical/physical address map for the memory system of the present invention.

As shown in FIG. 4, the memory 2 is a dynamic RAM having a capacity of one mega-bytes, wherein each location stores eight bits or one byte of data. The locations are arranged in 1024 rows × 1024 columns. This memory system comprises 16 blocks BLOCK 0 - BLOCK 15, each of which consists of 64 kilo-bytes or 64 columns of 1024 storage locations.

Assume now that one of the address lines from the drivers 8 and 9 (for example, the address line for addressing the row 2) is in failure. As shown in FIG. 4, all locations linked to this row 2 (0, 2), (1, 2), (2, 2), (3, 2) ... (1023, 2) will now be regarded as error locations. Because all the rows are shared by all the memory blocks, all the memory blocks will be determined as erroneous and excluded from access should any one row address line fail.

Figure 5:
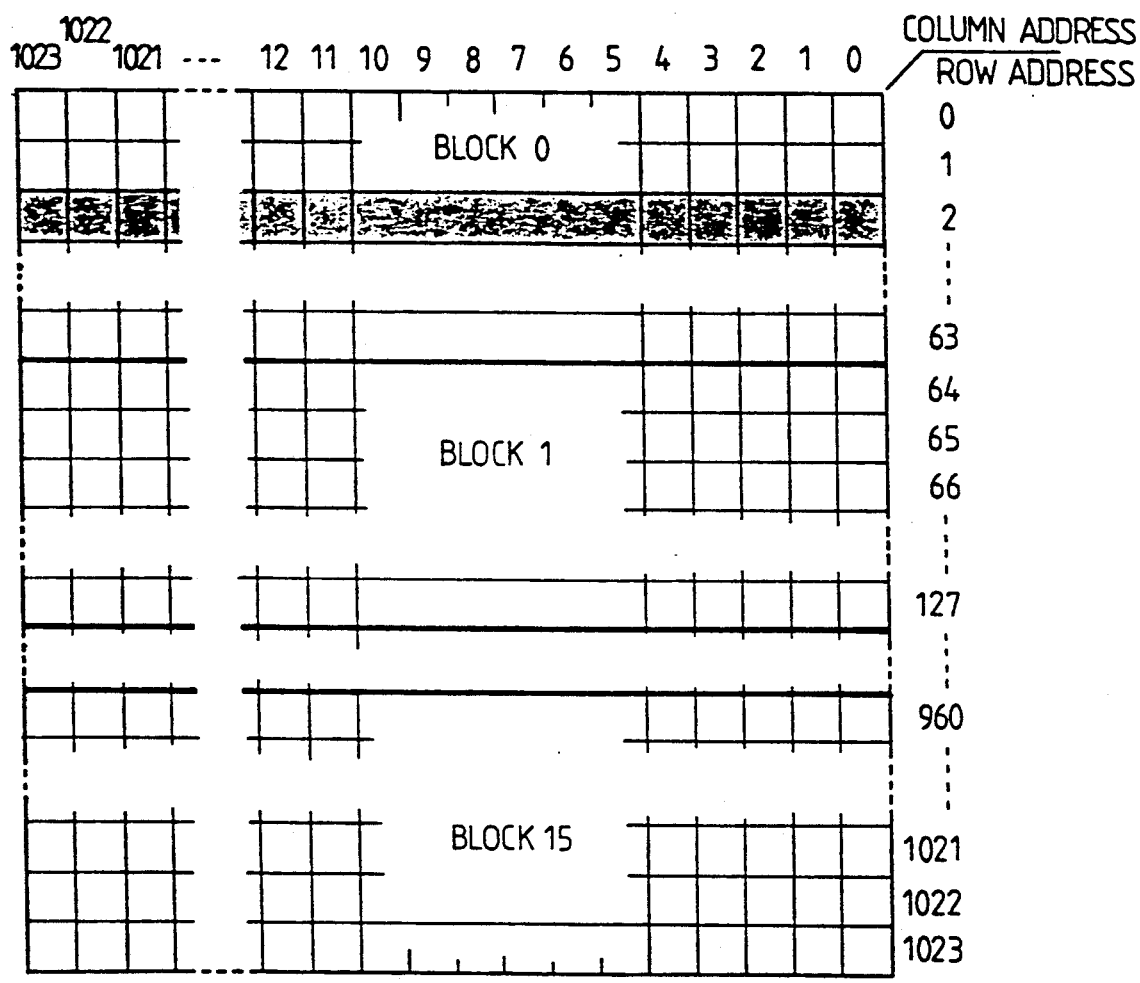
FIG. 5 is a second logical/physical address map for the memory system with the row/column address interchange of the present invention.

According to this invention, in order to maintain high usability of the memory should an address line fail, the address bits to be used as the row addresses and column addresses are interchanged for all of the memory blocks. FIG. 5 shows a memory map or distribution of locations wherein the row address bits and the column address bits of FIG. 4 are interchanged. Now, all locations related to the row 2 of FIG. 4 are on the same column 2 of a single block BLOCK 0. Accordingly, by excluding only BLOCK 0 from the blocks to be addressed, the remaining 15 blocks can be accessed even though one of address lines is in failure.

Figure 6:
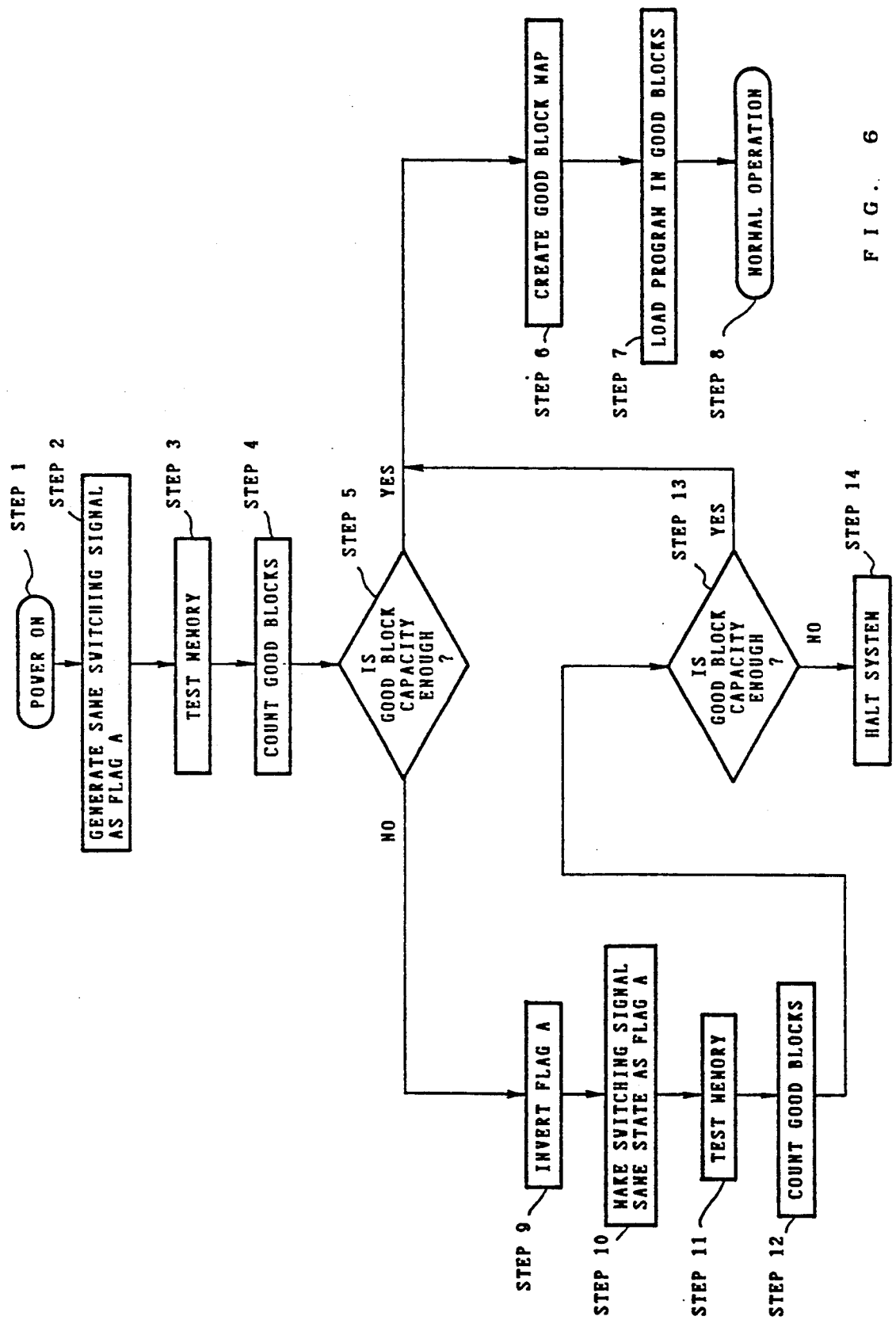
FIG. 6 is a flowchart of the operation of the present invention.

Now, the operation of the invention will be described with reference to the operation flowchart of the controller shown in FIG. 6. According to this embodiment, in loading a program into the memory system of the invention, a test is carried out to determine whether or not sufficient memory can be accessed to accommodate the program. In the controller 1, a nonvolatile memory is included for storing various parameters of the system, such as a flag bit A that is set to 0 when the memory system is manufactured. As the memory system is started in step 1, that is, as the power is turned on, a switching signal representing the state of flag A is generated on the control line 11 in Step 2 and a test is conducted on the memory in Step 3. In this test, the 20-bit address signals for all storage locations in the memory 2 are successively fed through the address line 3 to decoder 7 and through the data bus 10 to the memory 2. At this time, at each address, the selection signal on the control line 5 changes from 1 to 0. In response, to the multiplexer 4 and causes the upper ten bits of the 20-bit address signals to be fed to a row address line driver 8 through the address decoder 7, while the lower ten bits are subsequently fed through the decoder to the column address line driver 9.

The data stored at these respective locations are read out and tested to determine the presence of errors. Then, the blocks which are found containing error locations are excluded as error blocks from those to be addressed. In Step 4, the number of good memory blocks are counted. In Step 5, if the number of good blocks is sufficient to accommodate the predetermined program, a map of the storage location addresses within the good blocks is created in Step 6, and the program is loaded into the good blocks in Step 7, followed by normal operation in Step 8.

If there are not enough good blocks to store the program in Step 5, the flag A is inverted in Step 9. Then, in Step 10, flag A causes the switching signal on line 11 to assume a value of 1. Accordingly, the output of the XOR circuit 6 which is fed to the multiplexer 4 for each address changes from 0 to 1 in Step 11. Thus, the upper order address bits of the address signals are fed the column address line driver 9 through the decoder 7, while the lower order address bits are fed to the row address line driver 8. Accordingly, the distribution of the memory addresses and the memory blocks will now be arranged as shown in FIG. 5. Then, in Step 12 the number of good blocks are counted again, and in Step 13, a judgment is rendered on whether or not the capacity of the good blocks is sufficient to store the program. If the memory capacity is adequate, the process proceeds to the aforementioned Step 6. If the memory capacity is still insufficient to store the program, the system stops the process because of memory errors in Step 14.

Thus, in the invention a burst error causing a failure in an address line or its driver circuit is circumvented by changing the configuration of all of the memory blocks by interchanging the row and column addresses. The interchange is carried out in response to an address switching signal generated when the capacity of good memory blocks without error is insufficient to store a requisite amount of information. By virtue of this interchange, the burst error will be concentrated along an address line in a single block, resulting in increased capacity of usable blocks. At the same time, access delays are minimized because the address interchange is constant for all of the blocks, rather than being carried out on a block-by-block basis.

While the invention has been described with reference to its best mode, various modifications could be made to the teachings rendered above without departing from the spirit and scope of the invention. For example, while the memory blocks are shown as sharing row addresses prior to address interchange, the blocks could be configured as sharing column addresses prior to address interchange. Moreover, while the invention has been described with reference to a one mega-byte DRAM, it could be used with other memory technologies of other capacities. Further, while in the invention the good memory blocks are counted to see if sufficient storage capacity remains for a given storage application, as a practical matter the remaining capacity could be compared to a fixed standard (e.g. ½ good, ¼ good, etc.)

What is claimed is:

1. In a memory comprising a plurality of blocks of memory cells coupled together into a plurality of first lines and second lines orthogonal to one another, wherein all of said plurality of blocks share all of said first lines and wherein each of said plurality of blocks have different sets of said second lines, and address means for sequentially addressing one of said first lines and one of said second lines, respectively, an error correction circuit comprising means for producing an address mode change signal if any of said first lines are faulty; and access means for controlling said address means in response to said signal means, so that said address means sequentially addresses one of said second lines and one of said first lines, respectively, if said test means determines if one of said first lines is in error.

2. The memory system as recited in Claim 1, wherein said memory receives a multi-bit address signal, wherein at least some of the bits of said multi-bit address signal indicate one of said first lines or one of said second lines, and wherein remaining ones of the bits of said multi-bit address signal signal indicate one of said second lines or one of said first lines, respectively.

3. A memory system, comprising:

a plurality of blocks of memory cells accessed in by a first access mode, wherein all of said plurality of blocks of memory cells have at least a first line of memory cells in common; and access means responding to a signal indicating that said first line of memory cells is faulty for accessing all of said plurality of blocks of memory cells by a second access mode, wherein only one of said plurality of blocks of memory cells has said first line of memory cells, and wherein access to said one of said plurality of blocks is disabled.

4. The memory system as recited in Claim 3, wherein each of said plurality of blocks of memory lines of memory cells orthogonal to said first line of memory cells.

5. The memory system as recited in Claim 4 wherein each of said blocks of memory cells have a plurality of first lines of memory cells in common, and wherein each of said memory cells are coupled to a given one of said first lines and a given one of said second lines.

6. The memory system as recited in Claim 5 wherein when said plurality of blocks of memory cells are accessed in accordance with a second access mode, all of said plurality of blocks of memory cells have said plurality of second lines of memory cells in common.

7. A memory system, comprising:

an array of memory cells, each of said memory cells being connected to one of a plurality of row lines and to one of a plurality of column lines substantially orthogonal with respect to said row line;

access means receiving a multi-bit address signal, for accessing one of said plurality of row lines in accordance with at least some of the bits of said multi-bit address signal, and for accessing one of said plurality of column lines in accordance with remaining ones of said bits of said multi-bit address signal; and means for producing a signal indicating that at least one of said plurality of row lines are faulty, said access means responding to said signal for accessing one of said column lines in accordance with said at least some of the bits of said multi-bit address signal, and for accessing one of said plurality of row lines other than said at least one of said plurality of row lines that are faulty in accordance with said remaining ones of said bits of said multi-bit address signal.

8. A memory system, comprising:

a plurality of blocks of memory cells, each of said plurality of blocks of memory cells comprising a plurality of cells that are coupled to respective ones of a plurality of first access lines and to respective ones of a plurality of second access lines, wherein in a first access mode said plurality of blocks of memory cells have at least some of said plurality of first access lines in common and none of said plurality of second access lines in common, and wherein in a second access mode said plurality of blocks of memory cells have at least some of said plurality of second access lines in common and none of said plurality of first access lines lines in common;

access means responding to an address signal for accessing said plurality of cells in accordance with said first access mode; and control means for causing said access means to switch from said first access mode to said second access mode if at least one of said plurality of blocks of memory cells are faulty, wherein said access means by-passes said at least one of said plurality of blocks of memory cells.

9. A method of operating a memory system comprising a plurality of blocks of memory cells coupled together in a plurality of first lines and a plurality of second lines, and access means for accessing said memory cells in said plurality of blocks of memory cells by accessing one of said plurality of first lines and one of said plurality of second lines, respectively, comprising:

generating an error signal indicating that at least one of said plurality of blocks of memory cells are faulty; and operating said access means such that memory cells in remaining ones of said plurality of blocks of memory cells are accessed by accessing one of said plurality of second lines and one of said plurality of first lines, respectively.

10. The method as recited in Claim 9, wherein said step of generating an error signal includes the step of testing remaining ones of said plurality of blocks of memory cells to see if they are sufficient to store a given amount of information.

11. A method of operating a memory system comprising a plurality of blocks of memory cells accessed in a first access mode wherein said plurality of blocks of memory cells have at least a first line of memory cells in common, and access means for accessing a selected memory cell within one of said plurality of memory cells within one of said plurality of blocks, comprising:

generating an error signal indicating that said first line of memory cells is faulty; and operating said access means means such that all of said plurality of blocks of memory cells are accessed in a second access mode, wherein said only one of said plurality of blocks of memory cells has said first line of memory cells.

12. The method as recited in Claim 11, wherein said access means receives a multi-bit address signal.

13. The method as recited in Claim 12, wherein in said first access mode most significant bits in said multi-bit address signal indicate said first line of memory cells.

14. The method as recited in Claim 13, wherein in said second access mode least significant bits in said multi-bit address signal indicate said first line of memory cells.

15. The method as recited in Claim 11, wherein said access means prevents access to said one of said plurality of blocks of memory cells having said first line of memory cells.

* * * * *

UNITED STATES PATENT AND TRADEMARK OFFICE
CERTIFICATE OF CORRECTION

PATENT NO. : 5,109,360
DATED : April 28, 1992
INVENTOR(S) : Junichi Inazumi, et al.

It is certified that error appears in the above-identified patent and that said Letters Patent is hereby corrected as shown below:

On the title page, item (75) Inventors: Delete "Shigetaka Inazumi" and insert -- Shigetaka Kobayashi --.

Signed and Sealed this

Sixth Day of July, 1993

Attest:

MICHAEL K. KIRK

*Attesting Officer*    *Acting Commissioner of Patents and Trademarks*